(12) United States Patent
Kazama et al.

(10) Patent No.: US 9,404,941 B2
(45) Date of Patent: Aug. 2, 2016

(54) CONTACT PROBE AND PROBE UNIT

(75) Inventors: Toshio Kazama, Nagano (JP); Kazuya Souma, Nagano (JP); Akihiro Matsui, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 889 days.

(21) Appl. No.: 13/806,444

(22) PCT Filed: Jun. 23, 2011

(86) PCT No.: PCT/JP2011/064485
§ 371 (c)(1),
(2), (4) Date: Dec. 21, 2012

(87) PCT Pub. No.: WO2011/162362
PCT Pub. Date: Dec. 29, 2011

(65) Prior Publication Data
US 2013/0099814 A1    Apr. 25, 2013

(30) Foreign Application Priority Data

Jun. 25, 2010 (JP) ................................. 2010-145639
Nov. 15, 2010 (JP) ................................. 2010-254784

(51) Int. Cl.
*G01R 1/067* (2006.01)
*H01L 23/00* (2006.01)
(Continued)

(52) U.S. Cl.
CPC ............ *G01R 1/067* (2013.01); *G01R 1/06722* (2013.01); *G01R 1/07314* (2013.01); *H01L 24/72* (2013.01); *H01R 13/2421* (2013.01); *H05K 7/1069* (2013.01)

(58) Field of Classification Search
CPC .. H01L 24/72; H01R 13/2421; H05K 7/1069; G01R 1/07314; G01R 1/07335

USPC ............................................ 439/66, 482, 824
See application file for complete search history.

(56) References Cited

U.S. PATENT DOCUMENTS 2,916,723 A * 12/1959 Cronin ................... H01B 17/28
                                                    174/152 R
6,150,616 A    11/2000 Kazama
(Continued)

FOREIGN PATENT DOCUMENTS

| CN | 1323457 A | 11/2001 |
|----|-----------|---------|
| CN | 1518667 A | 8/2004  |

(Continued)

OTHER PUBLICATIONS

Supplementary European Search Report dated Jul. 30, 2015, issued for the European patent application No. 11798243.9.

(Continued)

*Primary Examiner* — Vinh Nguyen
*Assistant Examiner* — Dustin Dickinson
(74) *Attorney, Agent, or Firm* — Locke Lord LLP

(57) ABSTRACT

A contact probe includes a conductive first plunger including, on a same axis, a distal end portion, a flange portion, a boss portion, and a base end portion, a conductive second plunger including, on the same axis, a second distal end portion and a boss portion, and a coil spring including a coarsely wound portion formed by winding at a predetermined pitch with an inner diameter equal to or larger than a diameter of the boss portion of the first plunger and a tightly wound portion formed by tightly winding with an inner diameter substantially equal to a diameter of the boss portion of the second plunger, so that the first plunger and the second plunger are connected to each other on the same axis.

11 Claims, 5 Drawing Sheets

(51) Int. Cl.
*G01R 1/073* (2006.01)
*H05K 7/10* (2006.01)
*H01R 13/24* (2006.01)

(56) References Cited

U.S. PATENT DOCUMENTS

| | | | |
|---|---|---|---|
| 6,464,511 | B1 | 10/2002 | Watanabe et al. |
| 6,844,749 | B2 * | 1/2005 | Sinclair ............... G01R 1/0466 324/755.05 |
| 6,900,651 | B1 | 5/2005 | Kazama |
| 7,154,286 | B1 | 12/2006 | Marx et al. |
| 7,362,118 | B2 | 4/2008 | Henry et al. |
| 7,626,408 | B1 | 12/2009 | Kaashoek |
| 2003/0006787 | A1 * | 1/2003 | Kazama ............. G01R 1/06716 324/755.05 |
| 2005/0258843 | A1 | 11/2005 | Kazama |
| 2009/0183908 | A1 * | 7/2009 | Kazama ............. G01R 1/07371 174/262 |
| 2011/0171841 | A1 | 7/2011 | Tsubaki et al. |

FOREIGN PATENT DOCUMENTS

| | | |
|---|---|---|
| CN | 101563617 A | 10/2009 |
| JP | 10-239349 A | 9/1998 |
| JP | 2004-309490 A | 11/2004 |
| JP | 2005-189086 A | 7/2005 |
| JP | 2006-023177 A | 1/2006 |
| JP | 2007-287427 A | 11/2007 |
| JP | 2009-258100 A | 11/2009 |
| KR | 10-2001-0071815 A | 7/2001 |
| KR | 10-2004-0105878 A | 12/2004 |
| KR | 10-2009-0094843 A | 9/2009 |
| TW | 200728725 A | 8/2007 |
| TW | 201018007 A | 5/2010 |
| WO | WO-97/39361 A1 | 10/1997 |
| WO | WO-2009/011365 A1 | 1/2009 |
| WO | WO-2009/102030 A1 | 8/2009 |
| WO | WO-2010/016608 A1 | 2/2010 |

OTHER PUBLICATIONS

Office Action dated Jun. 9, 2015, issued for the corresponding Japanese patent application No. 2012-521543 and English translation thereof.
Notice of Allowance mailed Apr. 25, 2014, issued for the corresponding Korean patent application No. 2012-7033411 and partial English translation thereof.
Office Action mailed May 12, 2014, issued for the corresponding Chinese patent application No. 201180030709.0.
Office Action dated Nov. 8, 2013, issued for the Korean patent application No. 10-2012-7033411.
Office Action dated Nov. 27, 2013, issued for the Taiwanese patent application No. 100122162.
International Search Report dated Sep. 27, 2011, issued for PCT/JP2011/064485.

* cited by examiner

CONTACT PROBE AND PROBE UNIT

FIELD

The present invention relates to a contact probe and a probe unit used for inspection of a conduction state or operating characteristics of an inspection target such as a semiconductor integrated circuit or a liquid crystal panel.

BACKGROUND

In the related art, a probe unit accommodating a plurality of contact probes for electric connection between an inspection target and a signal processing apparatus outputting an inspection signal is used for inspection of a conduction state or operating characteristics of the inspection target such as a semiconductor integrated circuit or a liquid crystal panel. With respect to the probe unit, in the progress in high integration and miniaturization of the semiconductor integrated circuit or the liquid crystal panel of the related art, techniques capable of being adapted to highly integrated, miniaturized inspection target by reducing a pitch between contact probes have progressed.

Under this circumstance, in order to maintain and stabilize electric characteristics of the contact probe, a contact probe where a base portion which is not in contact with an external electrode is formed with a precious metal so as to secure electric stability and a distal end portion which is in contact with the external electrode is formed with different metals or metal alloys so as to suppress an increase in contact resistance due to attachment of an external electrode material and an oxide film of the external electrode material is disclosed (for example, refer to Patent Literature 1).

The contact probe disclosed in Patent Literature 1 is configured to include plungers of which the distal end portions are in contact with respective contact objects and an electrically conductive compression spring in a coil shape, which connects base end portions of the plungers. The compression spring is formed by winding a wire rod at a predetermined pitch, and an electric signal flows through the wire rod. When the distal end portion of each plunger is in contact with the contact object, the plunger exerts a force in the direction opposite to the force exerted from the contact object, so that the contact state between the plunger and the contact object is stabilized.

CITATION LIST

Patent Literature

Patent Literature 1: JP 2009-258100 A

SUMMARY

Technical Problem

However, in the contact probe disclosed in Patent Literature 1, the compression spring is wound at a predetermined pitch (coarsely wound), and thus, an induction coefficient is increased according to a length of the wire rod, so that a conduction defect may occur between the contact probe and a contact object.

The present invention is made in view of the above-described circumstances, and it is an object of the invention to provide a contact probe and a probe unit capable of obtaining secure conduction between a contact object and the contact probe or the probe unit.

Solution to Problem

To solve the problem described above and achieve the object, a contact probe according to the present invention includes: a conductive first contact member comprising, on a same axis, a first distal end portion having a tapered distal end shape, a first flange portion extending from a base end side of the first distal end portion and having a diameter larger than a diameter of the first distal end portion, a first boss portion extending from an end portion of the first flange portion different from the side of the first boss portion which is connected to the first distal end portion and having a diameter smaller than a diameter of the first flange portion, and a first base end portion extending from an end portion of the first boss portion different from the side of the first base end portion which is connected to the first flange portion and having a diameter smaller than a diameter of the first boss portion; a conductive second contact member comprising, on the same axis, a second distal end portion having a tapered distal end shape and a second boss portion extending from a base end side of the second distal end portion and having a diameter substantially equal to a diameter of the first base end portion; and a coil spring comprising a coarsely wound portion formed by winding at a predetermined pitch with an inner diameter larger than the diameter of the first base end portion and a tightly wound portion formed by tightly winding with an inner diameter substantially equal to the diameter of the second boss portion, an end portion of the coarsely wound portion being installed in the first boss portion, an end portion of the tightly wound portion being installed in the second boss portion, so that the first and second contact members are connected to each other on the same axis, wherein the first base end portion contacts with the tightly wound portion when a load having a magnitude equal to or greater than a predetermined magnitude is applied in a direction in parallel to an axis line and at least approaching to the second contact member.

In the contact probe according to the present invention as set forth in the invention described above, a distal end portion of the first base end portion different from a side of the first base end portion which is connected to the first boss portion has an R-chamfered shape.

In the contact probe according to the present invention as set forth in the invention described above, the end portion of the side of the first flange portion which is connected to the first distal end portion has a tapered shape.

In the contact probe according to the present invention as set forth in the invention described above, the coil spring includes a connection portion having a tapered shape formed by winding with a stepwise-decreasing diameter in the direction from the coarsely wound portion to the tightly wound portion.

A probe unit according to the present invention includes a plurality of the contact probes according to the invention described above; and a retaining portion which retains the contact probes.

In the probe unit according to the present invention as set forth in the invention described above, the end portion of the side of the first flange portion which is connected to the first distal end portion has a tapered shape, and the retaining portion has a first tapered portion having a shape corresponding to the tapered shape of the first flange portion.

In the probe unit according to the present invention as set forth in the invention described above, the retaining portion includes: a large diameter portion having a diameter larger than a diameter of the coarsely wound portion, and a small diameter portion having a diameter smaller than the diameter of the coarsely wound portion and larger than a diameter of the tightly wound portion.

In the probe unit according to the present invention as set forth in the invention described above, the coil spring is in a tapered shape formed by winding with a stepwise-decreasing diameter in a direction from the coarsely wound portion to the tightly wound portion, and the retaining portion includes a second tapered portion having a tapered shape corresponding to the tapered shape of the coil spring between the large diameter portion and the small diameter portion.

In the probe unit according to the present invention as set forth in the invention described above, the second distal end portion includes a second flange portion having a diameter larger than a diameter of a distal end side thereof at an end portion side thereof which is connected to the second boss portion, an end portion of the distal end side of the second flange portion has a tapered shape, and the retaining portion includes a third tapered portion having a shape corresponding to the tapered shape of the second flange portion.

Advantageous Effects of Invention

In a contact probe and a probe unit according to the present invention, since an inner diameter of a coil spring is varied, a base end portion of a first plunger and a tightly wound portion of the coil spring are in contact with each other only during conduction, and thus, a coarsely wound portion thereof and the base end portion are not in contact with each other, so that it is possible to obtain more secure conduction.

DESCRIPTION OF EMBODIMENTS

Hereinafter, embodiments for embodying the present invention will be described in detail with reference to the drawings. In addition, the invention is not limited to the following embodiments. In addition, in each figure referred to for the description hereinafter, shapes, sizes, and positional relations are diagrammatically illustrated to a degree that the invention can be understood. In other words, the invention is not limited to shapes, sizes, and positional relations illustrated in each figure.

First Embodiment

Figure 1:
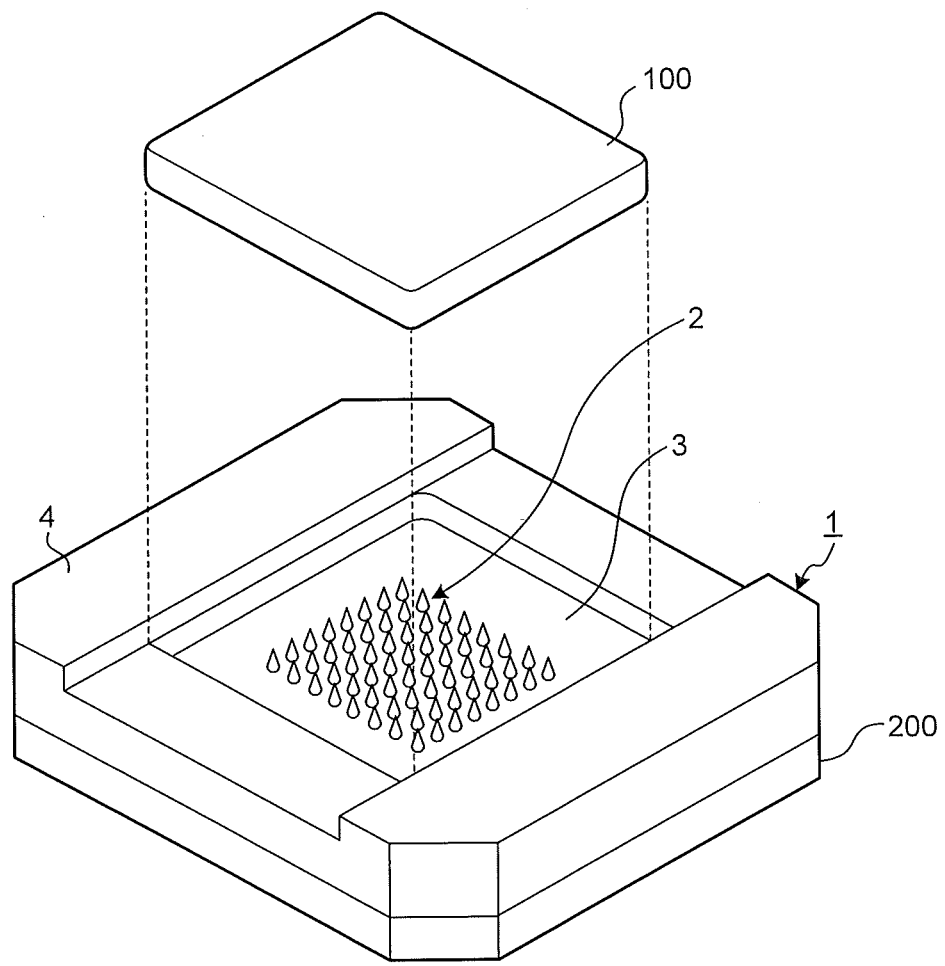
FIG. 1 is a perspective view illustrating a configuration of a probe unit according to a first embodiment of the invention.

FIG. 1 is a perspective view illustrating a configuration of a probe unit according to a first embodiment of the invention. The probe unit 1 illustrated in FIG. 1 is an apparatus used for inspection of electric characteristics of a semiconductor integrated circuit 100 which is an inspection target and is an apparatus electrically connecting between the semiconductor integrated circuit 100 and a circuit substrate 200 which outputs an inspection signal to the semiconductor integrated circuit 100.

The probe unit 1 includes conductive contact probes 2 (hereinafter, simply referred to as "probes 2"), each of which is in contact with the semiconductor integrated circuit 100 and the circuit substrate 200 which are two different contact objects at two ends thereof in the longitudinal direction, a probe holder 3 which accommodates a plurality of the probes 2 in a predetermined pattern to retain the probes 2, and a holder member 4 which is installed in the vicinity of the probe holder 3 to suppress occurrence of positional deviation of the semiconductor integrated circuit 100 which is in contact with a plurality of the probes 2 during the inspection.

Figure 2:
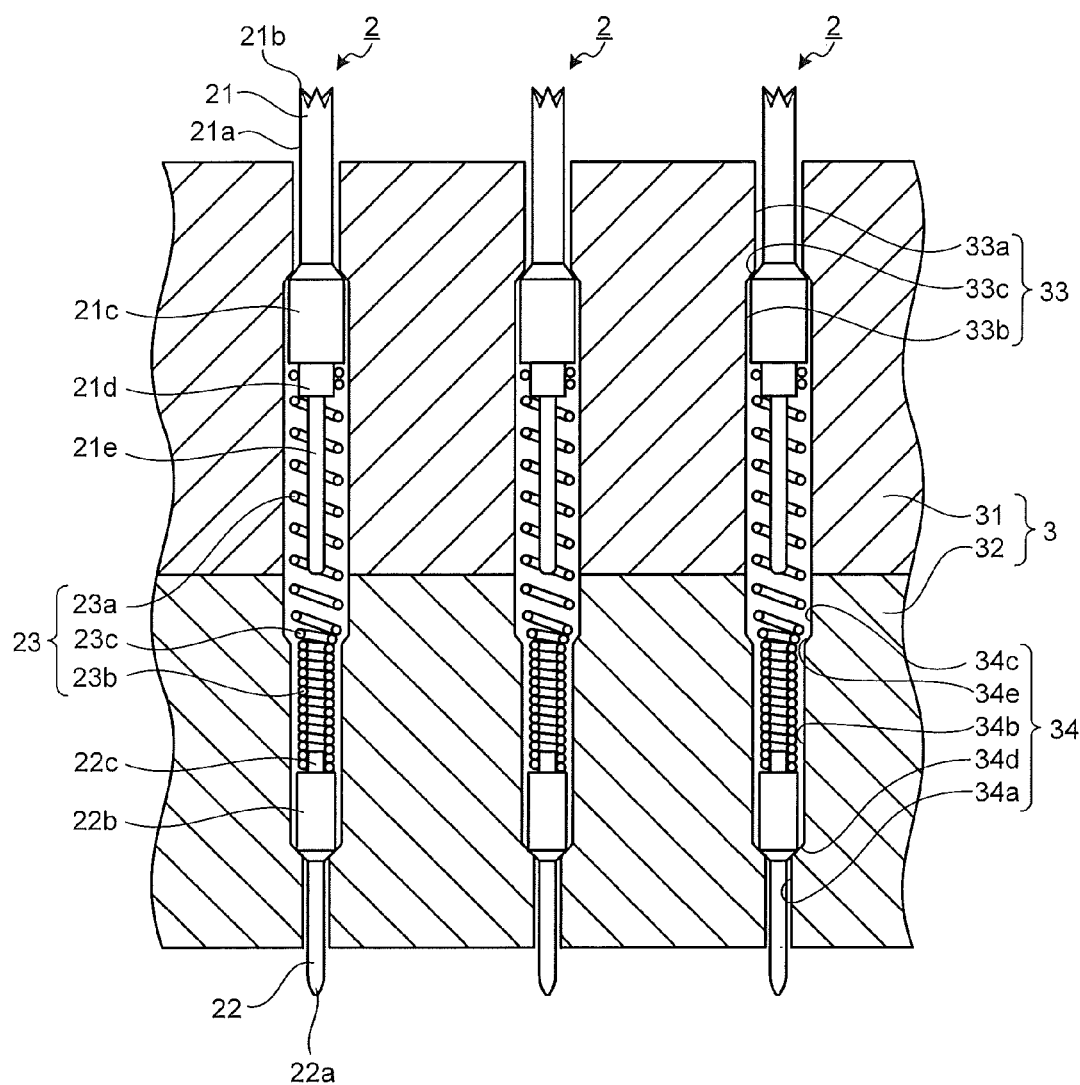
FIG. 2 is a partial cross-sectional view illustrating a configuration of main components of the probe unit according to the first embodiment of the invention.

FIG. 2 is a diagram illustrating a detailed configuration of the probe 2 accommodated in the probe holder 3. The probe 2 illustrated in FIG. 2 is formed by using a conductive material. The probe 2 includes a first plunger 21 (first contact member) which is in contact with a connection electrode of the semiconductor integrated circuit 100 during the inspection of the semiconductor integrated circuit 100, a second plunger 22 (second contact member) which is in contact with an electrode of the circuit substrate 200 having an inspection circuit, and a coil spring 23 which is installed between the first plunger 21 and the second plunger 22 to elastically connect the two plungers, that is, the first plunger 21 and second plunger 22. The first plunger 21, the second plunger 22, and the coil spring 23 constituting the probe 2 have the same axis line. When the probe 2 is in contact with the semiconductor integrated circuit 100, the coil spring 23 is expanded/contracted in the axis line direction, so that an impact on the connection electrode of the semiconductor integrated circuit 100 is lessened, and a load is applied to the semiconductor integrated circuit 100 and the circuit substrate 200.

The first plunger 21 includes, on the same axis, a distal end portion 21a (first distal end portion) having a tapered distal end shape and having a plurality of claw portions 21b, a flange portion 21c (first flange portion) extending from a base end side of the distal end portion 21a and having a diameter larger than a diameter of the distal end portion 21a, a boss portion 21d (first boss portion) extending from an end portion different from the side of the flange portion 21c which is connected to the distal end portion 21a and having a diameter smaller than a diameter of the flange portion 21c, and a base end portion 21e (first base end portion) extending from an end portion different from the side of the boss portion 21d which is connected to the flange portion 21c and having a diameter smaller than a diameter of the boss portion 21d. The end portion of the side of the flange portion 21c which is connected to the distal end portion 21a has a tapered shape. In addition, the distal end of the base end portion 21e has an R-chamfered shape.

The second plunger 22 includes, on the same axis, a distal end portion 22a having a tapered distal end shape, a flange portion 22b extending from a base end side of the distal end portion 22a and having a diameter larger than a diameter of the distal end portion 22a, and a boss portion 22c (second boss portion) extending from an end portion different from a side of the flange portion 22b which is connected to the distal end portion 22a and having a diameter substantially equal to a diameter of the base end portion 21e. The end portion of the side of the flange portion 22b which is connected to the distal end portion 22a has a tapered shape. The second plunger 22 can be moved in the axis line direction by an expansion/ contraction operation of the coil spring 23 and can be biased toward the circuit substrate 200 by an elastic force of the coil spring 23 to be in contact with the electrode of the circuit substrate 200. In addition, the second distal end portion corresponds to the distal end portion 22a and the flange portion 22b.

With respect to the coil spring 23, the side which is connected to the first plunger 21 is a coarsely wound portion 23a which is formed by winding at a predetermined pitch with an inner diameter equal to or larger than a diameter of the base end portion 21e; and the side which is connected to the second plunger 22 is a tightly wound portion 23b which is formed by winding with an inner diameter substantially equal to a diameter of the boss portion 22c. A connection portion 23c connecting the coarsely wound portion 23a and the tightly wound portion 23b has a shape formed by winding with a stepwise-decreasing inner diameter in the direction from the coarsely wound portion 23a to the tightly wound portion 23b. For example, in the case where the inner diameter of the coarsely wound portion 23a is substantially equal to that of the boss portion 21d, the end portion of the coarsely wound portion 23a is pressed into the boss portion 21d and contacted with the flange portion 21c. On the other hand, the end portion of the tightly wound portion 23b is pressed into the boss portion 22c and contacted with the flange portion 22b. In addition, the inner diameter of the coarsely wound portion 23a may be a length to a degree that the coarsely wound portion 23a can contact with the flange portion 21c. In addition, the first plunger 21 and the second plunger 22 may be connected to the coil spring 23 by soldering. The connection portion 23c may be formed by tightly winding or by winding at a predetermined pitch.

As a wire rod used for the coil spring 23, a conductive metal having a spring characteristic (stroke) is used, where a contraction amount of the coarsely wound portion 23a when a predetermined load is applied thereto is larger than the shortest distance between the base end portion 21e and the tightly wound portion 23b when an initial load is applied thereto, for example, in the state where the probe 2 is accommodated in the probe holder 3 (refer to FIG. 1). Due to the use of the coil spring 23 having the spring characteristics, in the case where a predetermined load is applied to the probe 2, the base end portion 21e is made to be in sliding contact with the tightly wound portion 23b, so that electric conduction between the base end portion 21e and the tightly wound portion 23b can be obtained.

The probe holder 3 is formed by using an insulating material such as a resin, a machinable ceramic, silicon and is configured by stacking a first member 31 disposed at the upper surface side of FIG. 2 on a second member 32 disposed at the lower surface side thereof. In the first member 31 and the second member 32, holder holes 33 and 34, of which the numbers are the same, are formed as retaining portions for accommodating a plurality of the probes 2. The holder holes 33 and 34 accommodating the probe 2 are formed so that the axis lines thereof are coincident with each other. The formation positions of the holder holes 33 and 34 are determined according to a wiring pattern of the semiconductor integrated circuit 100.

The holder holes 33 and 34 have a shape of step holes having different diameters along the penetration direction. In other words, the holder hole 33 includes a small diameter portion 33a having an opening on an upper end surface of the probe holder 3, a large diameter portion 33b having a diameter larger than a diameter of the small diameter portion 33a, and a tapered portion 33c (first tapered portion) connecting the small diameter portion 33a and the large diameter portion 33b and having a shape corresponding to a tapered shape of the flange portion 21c. The small diameter portion 33a has a diameter smaller than a diameter of the large diameter portion 33b and slightly larger than a diameter of the distal end portion 21a. The large diameter portion 33b has a diameter slightly larger than a diameter of the coarsely wound portion 23a of the coil spring 23 and/or a diameter of the flange portion 21c.

On the other hand, the holder hole 34 includes a small diameter portion 34a having an opening on a lower end surface of the probe holder 3, a middle diameter portion 34b having a diameter larger than a diameter of the small diameter portion 34a, a large diameter portion 34c having a diameter larger than a diameter of the middle diameter portion 34b and equal to a diameter of the large diameter portion 33b, a tapered portion 34d (third tapered portion) connecting the small diameter portion 34a and the middle diameter portion 34b and having a tapered shape corresponding to a tapered shape of the second flange portion 22b, and a tapered portion 34e (second tapered portion) connecting the middle diameter portion 34b and the large diameter portion 34c and having a shape corresponding to a tapered shape of the connection portion 23c of the coil spring 23. The small diameter portion 34a has a diameter smaller than a diameter of the middle diameter portion 34b and slightly larger than a diameter of the distal end portion 22a. In addition, the middle diameter portion 34b has a diameter smaller than a diameter of the large diameter portion 34c and slightly larger than a diameter of the tightly wound portion 23b of the coil spring 23 and/or a diameter of the flange portion 22b. The large diameter portion 34c has a diameter equal to a diameter of the large diameter portion 33b.

The flange portion 21c of the first plunger 21 contacts with the tapered portion 33c of the holder hole 33, so that the probe 2 has a function of stopping extraction from the probe holder 3 of the probe 2. In addition, the flange portion 22b of the second plunger 22 contacts with the tapered portion 34d of the holder hole 34, so that the probe 2 has a function of stopping extraction from the probe holder 3 of the probe 2. In addition, each interface wall surface of the holder holes 33 and 34 may have a step shape corresponding to diameters of the flange portions 21c and 22b and the coil spring 23.

Figure 3:
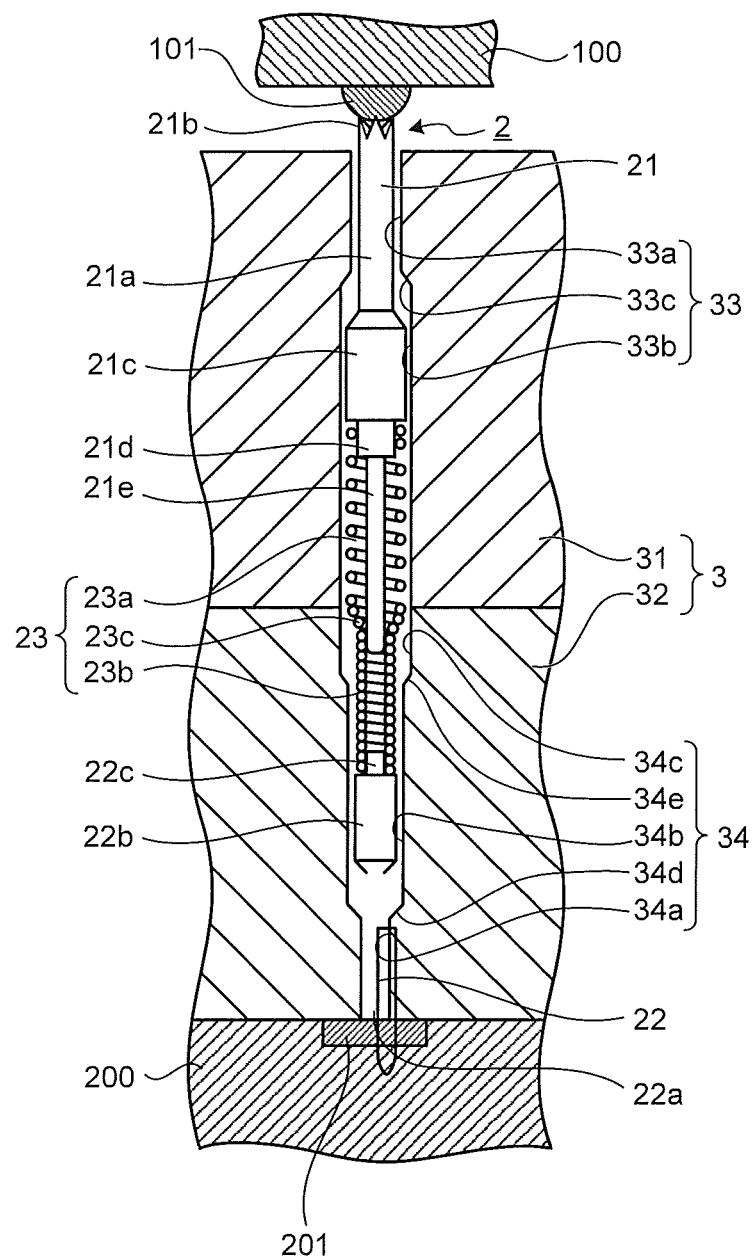
FIG. 3 is a partial cross-sectional view illustrating a configuration of main components of the probe unit during inspection of a semiconductor integrated circuit according to the first embodiment of the invention.

FIG. 3 is a diagram illustrating a state during inspection of the semiconductor integrated circuit 100 using the probe holder 3. During the inspection of the semiconductor integrated circuit 100, the coil spring 23 is in a compressed state in the longitudinal direction due to the contact load from the semiconductor integrated circuit 100. If the coil spring 23 is compressed, as illustrated in FIG. 3, the base end portion 21e of the first plunger 21 is inserted into the tightly wound portion 23b to be in sliding contact with the inner circumference side of the tightly wound portion 23b. At this time, since the axis line of the first plunger 21 is not greatly shaken, the sliding contact between the base end portion 21e and the inner circumference of the tightly wound portion 23b is stabilized, and the tightly wound portion 23b is slightly meandered, so that contact resistance between the base end portion 21e and the coil spring 23 is stabilized. Accordingly, secure conduction can be obtained.

Moreover, since the distal end of the claw portion 21b is formed in a tapered shape, even in a case where an oxide film is formed on a surface of a connection electrode 101, the oxide film can be burst, so that the distal end of the claw portion 21b can be in direct contact with the connection electrode 101.

The inspection signal supplied from the circuit substrate 200 to the semiconductor integrated circuit 100 during the inspection is transmitted from an electrode 201 of the circuit substrate 200 through the second plunger 22, the tightly wound portion 23b, and the first plunger 21 of the probe 2 to reach the connection electrode 101 of the semiconductor integrated circuit 100. In this manner, in the probe 2, the first plunger 21 and the second plunger 22 are conducted to each other through the tightly wound portion 23b, so that the conduction path of the electric signal can be minimized. Therefore, the signal is prevented from flowing through the coarsely wound portion 23a during the inspection, so that it is possible to reduce and stabilize the induction coefficient and the resistance.

According to the above-described first embodiment, since the base end portion having a diameter smaller than the inner diameter of the coarsely wound portion and the tightly wound portion formed by winding with an inner diameter substantially equal to or smaller than that of the base end portion are allowed to be in contact with each other to be conducted, and the coarsely wound portion is configured where a signal is hard to be conducted, an electric signal is allowed to securely flow between the circuit substrate and the semiconductor integrated circuit, so that the inspection accuracy can be maintained. In addition, since the distal end of the first base end portion has an R-chamfered shape, when the base end portion is allowed to abut on the connection portion of the coil spring, the base end portion can be inserted into the tightly wound portion without interrupting the movement direction.

In addition, since each distal-end-portion-side end portion of each flange portion and each interface wall surface between the large diameter portion (middle diameter portion) and the small diameter portion of the holder hole have tapered surfaces, so that it is possible to obtain an effect of position alignment in the direction perpendicular to the axis line direction of the first plunger 21 when the probe is installed in the holder.

Moreover, the base end portion 21e may be connected to the boss portion such that, in the vicinity of the connection portion to the boss portion 21d, the diameter of the base end portion 21e is stepwise or continuously increased in the direction approaching the boss portion 21d, or the diameter of the connection-side end portion of the base end portion 21e is equal to the diameter of the boss portion 21d.

Furthermore, although the first distal end portion is described to have a plurality of claw portions, the first distal end portion may be formed such that the first distal end portion has a spindle shape having one vertex or so that the end portion thereof has a flat plane perpendicular to the longitudinal direction of the first distal end portion according to a shape of a contact object. The end portion of the second distal end portion can correspond to the shape of the contact object and also has the same configuration.

Moreover, although the second distal end portion is described to be configured to include the distal end portion 22a and the flange portion 22b, in the case where the second distal end portion is installed as a portion of the probe unit 1 as illustrated in FIG. 1, the second distal end portion may be configured not to include the flange portion 22b. In the configuration where the second plunger 22 is not included, the tightly wound portion 23b may be in direct contact with the electrode 201 of the circuit substrate 200. In this case, the end portion of the side of the tightly wound portion 23b which is in contact with the circuit substrate 200 may be formed in a tapered shape.

Second Embodiment

Figure 4:
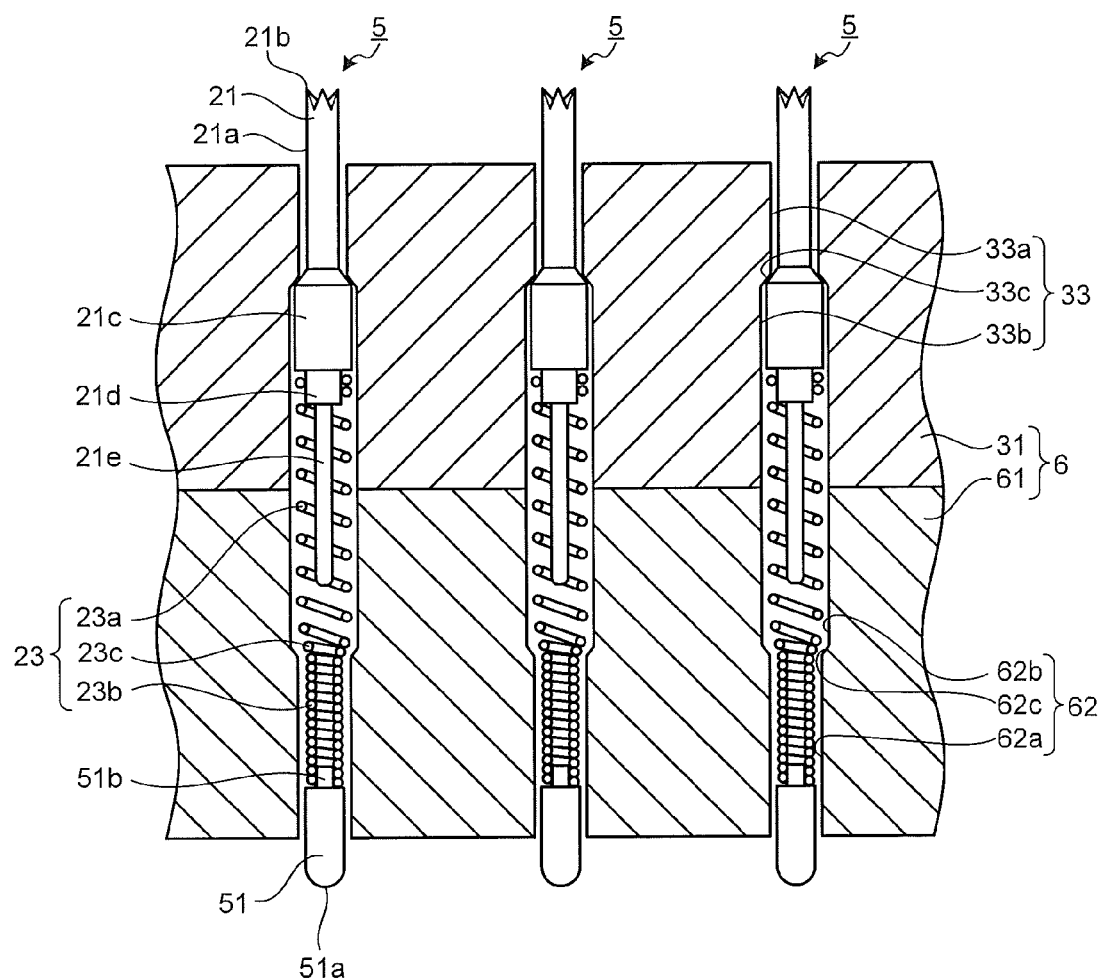
FIG. 4 is a partial cross-sectional view illustrating a configuration of main components of the probe unit according to a second embodiment of the invention.

FIG. 4 is a partial cross-sectional view illustrating a configuration of main components of the probe unit according to a second embodiment of the invention. Moreover, the same components as those of the probe unit 1 described above with reference to FIG. 1 and the like are denoted by the same reference numerals. A probe 5 illustrated in FIG. 4 is retained by a probe holder 6 and, similarly to the first embodiment, is formed by using a conductive material. The probe 5 includes a first plunger 21 (first contact member) which is in contact with a connection electrode of the semiconductor integrated circuit 100 during the inspection of the semiconductor integrated circuit 100 illustrated in FIG. 1, a second plunger 51 (second contact member) which is in contact with an electrode of the circuit substrate 200 having an inspection circuit, a coil spring 23 which is installed between the first plunger 21 and the second plunger 51 to elastically connect the two plungers, that is, the first plunger 21 and the second plunger 51. The first plunger 21, the second plunger 51, and the coil spring 23 constituting the probe 5 have the same axis line. When the probe 5 is in contact with the semiconductor integrated circuit 100, the coil spring 23 is expanded/contracted in the axis line direction, so that an impact on the connection electrode of the semiconductor integrated circuit 100 is lessened, and a load is applied to the semiconductor integrated circuit 100 and the circuit substrate 200.

The second plunger 51 includes, on the same axis, a distal end portion 51a having a tapered distal end shape and a boss portion 51b (second boss portion) extending from a base end side of the distal end portion 51a and having a diameter substantially equal to a diameter of the base end portion 21e. The second plunger 51 can be moved in the axis line direction by an expansion/contraction operation of the coil spring 23 and can be biased toward the circuit substrate 200 by an elastic force of the coil spring 23 to be in contact with the electrode of the circuit substrate 200.

With respect to the coil spring 23, the side which is connected to the first plunger 21 is a coarsely wound portion 23a which is formed by winding at a predetermined pitch with an inner diameter equal to or larger than a diameter of the boss portion 21d; and the side which is connected to the second plunger 51 is a tightly wound portion 23b which is formed by winding with an inner diameter substantially equal to a diameter of the boss portion 51b. A connection portion 23c connecting the coarsely wound portion 23a and the tightly wound portion 23b has a shape formed by winding with a stepwise-decreasing inner diameter in the direction from the coarsely wound portion 23a to the tightly wound portion 23b. The end portion of the coarsely wound portion 23a is pressed into the boss portion 21d and contacted with the flange portion 21c. On the other hand, the end portion of the tightly wound portion 23b is pressed into the boss portion 51b and contacted with the distal end portion 51a. In addition, the inner diameter of the coarsely wound portion 23a may be a length to a degree that the coarsely wound portion 23a can abut on the flange portion 21c. Moreover, the first plunger 21 and the second plunger 51 may be connected to the coil spring 23 by soldering.

The probe holder 6 is formed by using an insulating material such as a resin, a machinable ceramic, silicon and is configured by stacking a first member 31 disposed at the upper surface side of FIG. 4 on a second member 61 disposed at the lower surface side thereof. In the first member 31 and the second member 61, holder holes 33 and 62, of which the numbers are the same, are formed as retaining portions for accommodating a plurality of the probes 5. The holder holes 33 and 62 accommodating the probe 5 are formed so that the axis lines thereof are coincident with each other. The formation positions of the holder holes 33 and 62 are determined according to a wiring pattern of the semiconductor integrated circuit 100.

The holder hole 62 includes a small diameter portion 62a having an opening on a lower end surface of the probe holder 6, a large diameter portion 62b having a diameter larger than a diameter of the small diameter portion 62a, and a tapered portion 62c (second tapered portion) connecting the small diameter portion 62a and the large diameter portion 62b and having a tapered shape corresponding to a tapered shape of the connection portion 23c of the coil spring 23. The small diameter portion 62a has a diameter smaller than a diameter of the coarsely wound portion 23a (the large diameter portion 62b) and slightly larger than a diameter of the distal end portion 51a or a diameter of the tightly wound portion 23b. The large diameter portion 62b has a diameter equal to a diameter of the large diameter portion 33b.

Similarly to the first embodiment, the flange portion 21c of the first plunger 21 is contacted with the tapered portion 33c of the holder hole 33, so that the probe 5 has a function of stopping extraction from the probe holder 6 of the probe 5. Moreover, the connection portion 23c of the coil spring 23 is contacted with the tapered portion 62c of the holder hole 62, so that the probe 5 has a function of stopping extraction from the probe holder 6 of the probe 5. Furthermore, each interface wall surface of the holder holes 33 and 62 may have a step shape corresponding to diameters of the flange portion 21c and the coil spring 23.

Figure 5:
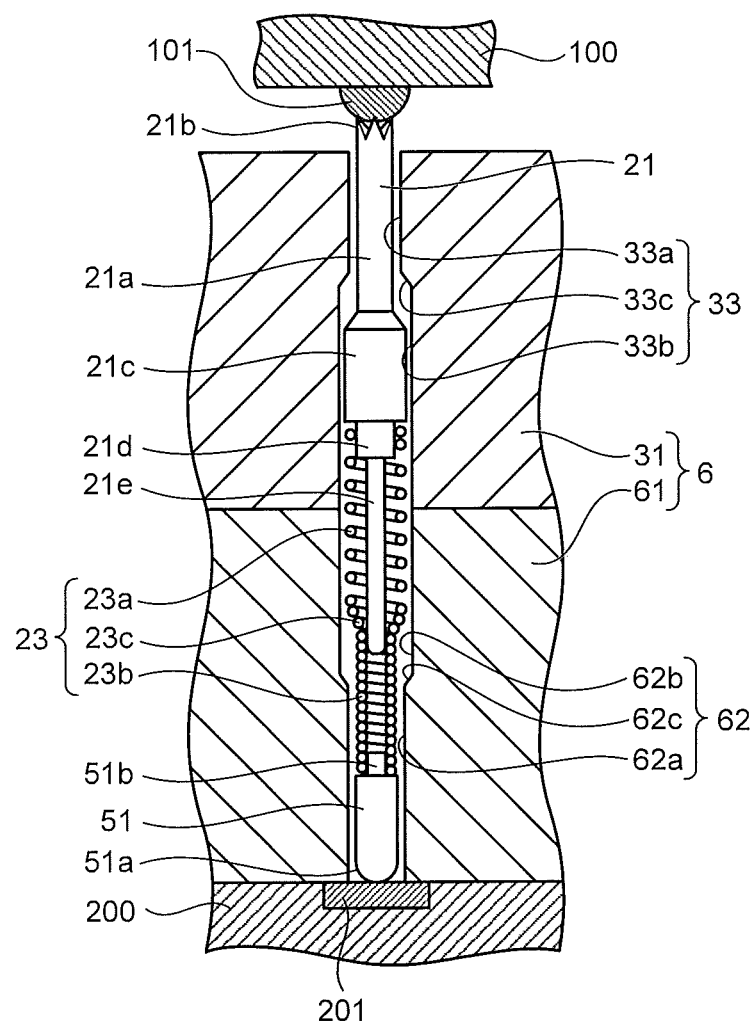
FIG. 5 is a partial cross-sectional view illustrating a configuration of main components of the probe unit during inspection of a semiconductor integrated circuit according to the second embodiment of the invention.

FIG. 5 is a diagram illustrating a state of the semiconductor integrated circuit 100 during inspection using the probe holder 6. During the inspection of the semiconductor integrated circuit 100, the coil spring 23 is in a compressed state in the longitudinal direction due to the contact load from the semiconductor integrated circuit 100. If the coil spring 23 is compressed, as illustrated in FIG. 5, the base end portion 21e of the first plunger 21 is inserted into the tightly wound portion 23b to be in sliding contact with the inner circumference side of the tightly wound portion 23b. At this time, since the axis line of the first plunger 21 is not greatly shaken, contact resistance between the base end portion 21e and the coil spring 23 is stabilized, so that secure electric conduction can be obtained.

The inspection signal supplied from the circuit substrate 200 to the semiconductor integrated circuit 100 during the inspection is transmitted from an electrode 201 of the circuit substrate 200 through the second plunger 51, the tightly wound portion 23b, and the first plunger 21 of the probe 5 to reach the connection electrode 101 of the semiconductor integrated circuit 100. In this manner, in the probe 5, the first plunger 21 and the second plunger 51 are conducted to each other through the tightly wound portion 23b, so that the conduction path of the electric signal can be minimized. Therefore, the signal is prevented from flowing through the coarsely wound portion 23a during the inspection, so that it is possible to reduce and stabilize the induction coefficient and the resistance.

According to the above-described second embodiment, similarly to the first embodiment, since the base end portion having a diameter smaller than the inner diameter of the coarsely wound portion and the tightly wound portion formed by winding with an inner diameter substantially equal to that of the base end portion are allowed to be in contact with each other to be conducted, and the coarsely wound portion is configured where a signal is hard to be conducted, an electric signal is allowed to securely flow between the circuit substrate and the semiconductor integrated circuit, so that the inspection accuracy can be maintained. In addition, since the distal end of the first base end portion has an R-chamfered shape, when the base end portion is allowed to abut on the connection portion of the coil spring, the base end portion can be inserted into the tightly wound portion without interrupting the movement direction.

Moreover, since the connection portion of the coil spring is contacted with the tapered portion of the probe holder, the probe has a function of stopping extraction from the probe holder of the probe, and at the same time, since the second plunger has a simple configuration, the process of forming a step shape of the holder hole is not performed in comparison with the configuration of the first embodiment, so that it is possible to reduce production cost or the like.

Moreover, in the first and second embodiments described above, if the probe has an extraction stopping function due to the tapered portion formed in the second member of the probe holder, the first member may be configured with only a large diameter portion having no tapered portion (step shape).

INDUSTRIAL APPLICABILITY

As described hereinbefore, a contact probe and a probe unit according to the invention can be useful to be connected to an electrode so as to conduct an electric signal.

REFERENCE SIGNS LIST

1: probe unit
2, 5: contact probe (probe)
3, 6: probe holder
21: first plunger
21a, 22a: distal end portion
21b: claw portion
21c, 22b: flange portion
21d, 22c: boss portion
21e: base end portion
22, 51: second plunger
23 coil spring
23a: coarsely wound portion
23b: tightly wound portion
23c: connection portion
31: first member
32, 61: second member
33, 34, 62: holder hole
33a, 34a, 62a: small diameter portion
33b, 34c, 62b: large diameter portion
33c, 34d, 34e, 62c: tapered portion
34b: middle diameter portion
100: semiconductor integrated circuit
101: connection electrode
200: circuit substrate

The invention claimed is:
1. A contact probe comprising:
a conductive first contact member comprising, on a same axis, a first distal end portion having a tapered distal end shape, a first flange portion extending from a base end side of the first distal end portion and having a diameter larger than a diameter of the first distal end portion, a first boss portion extending from an end portion of the first flange portion different from the side of the first flange portion which is connected to the first distal end portion and having a diameter smaller than a diameter of the first flange portion, and a first base end portion extending from an end portion of the first boss portion different from the side of the first base end portion which is connected to the first flange portion and having a diameter smaller than a diameter of the first boss portion;

a conductive second contact member comprising, on the same axis, a second distal end portion having a tapered distal end shape and a second boss portion extending from a base end side of the second distal end portion and having a diameter substantially equal to a diameter of the first base end portion; and a coil spring comprising a coarsely wound portion formed by winding at a predetermined pitch with an inner diameter larger than the diameter of the first base end portion and a tightly wound portion formed by tightly winding with an inner diameter substantially equal to the diameter of the second boss portion, an end portion of the coarsely wound portion being installed in the first boss portion, an end portion of the tightly wound portion being installed in the second boss portion, so that the first and second contact members are connected to each other on the same axis, wherein the first base end portion contacts with the tightly wound portion when a load having a magnitude equal to or greater than a predetermined magnitude is applied in a direction in parallel to an axis line and at least approaching to the second contact member.

2. The contact probe according to claim 1, wherein a distal end portion of the first base end portion different from a side of the first base end portion which is connected to the first boss portion has an R-chamfered shape.

3. The contact probe according to claim 1, wherein the end portion of the side of the first flange portion which is connected to the first distal end portion has a tapered shape.

4. The contact probe according to claim 1, wherein the coil spring comprises a connection portion having a tapered shape formed by winding with a stepwise-decreasing diameter in the direction from the coarsely wound portion to the tightly wound portion.

5. A probe unit comprising:

a plurality of the contact probes, each comprising:

a conductive first contact member comprising, on a same axis a first distal end portion having a tapered distal end shape, a first flange portion extending from a base end side of the first distal end portion and having a diameter larger than a diameter of the first distal end portion, a first boss portion extending from an end portion of the first flange portion different from the side of the first flange portion which is connected to the first distal end portion and having a diameter smaller than a diameter of the first flange portion, and a first base end portion extending from an end portion of the first boss portion different from the side of the first base end portion which is connected to the first flange portion and having a diameter smaller than a diameter of the first boss portion; a conductive second contact member comprising, on the same axis, a second distal end portion having a tapered distal end shape and a second boss portion extending from a base end side of the second distal end portion and having a diameter substantially equal to a diameter of the first base end portion; and a coil spring comprising a coarsely wound portion formed by winding at a predetermined pitch with an inner diameter larger than the diameter of the first base end portion and a tightly wound portion formed by tightly winding with an inner diameter substantially equal to the diameter of the second boss portion, an end portion of the coarsely wound portion being installed in the first boss portion, an end portion of the tightly wound portion being installed in the second boss portion, so that the first and second contact members are connected to each other on the same axis, wherein the first base end portion contacts with the tightly wound portion when a load having a magnitude equal to or greater than a predetermined magnitude is applied in a direction in parallel to an axis line and at least approaching to the second contact member; and a retaining portion which retains the contact probes.

6. The probe unit according to claim 5, wherein the end portion of the side of the first flange portion which is connected to the first distal end portion has a tapered shape, and the retaining portion has a first tapered portion having a shape corresponding to the tapered shape of the first flange portion.

7. The probe unit according to claim 5, wherein the retaining portion comprises:

a large diameter portion having a diameter larger than a diameter of the coarsely wound portion, and a small diameter portion having a diameter smaller than the diameter of the coarsely wound portion and larger than a diameter of the tightly wound portion.

8. The probe unit according to claim 7, wherein the coil spring is in a tapered shape formed by winding with a stepwise-decreasing diameter in a direction from the coarsely wound portion to the tightly wound portion, and the retaining portion comprises a second tapered portion having a tapered shape corresponding to the tapered shape of the coil spring between the large diameter portion and the small diameter portion.

9. The probe unit according to claim 5, wherein the second distal end portion comprises a second flange portion having a diameter larger than a diameter of a distal end side thereof at an end portion side thereof which is connected to the second boss portion, an end portion of the distal end side of the second flange portion has a tapered shape, and the retaining portion comprises a third tapered portion having a shape corresponding to the tapered shape of the second flange portion.

10. The probe unit according to claim 6, wherein the retaining portion comprises:

a large diameter portion having a diameter larger than a diameter of the coarsely wound portion, and a small diameter portion having a diameter smaller than the diameter of the coarsely wound portion and larger than a diameter of the tightly wound portion.

11. The probe unit according to claim 10, wherein the coil spring is in a tapered shape formed by winding with a stepwise-decreasing diameter in a direction from the coarsely wound portion to the tightly wound portion, and the retaining portion comprises a second tapered portion having a tapered shape corresponding to the tapered shape of the coil spring between the large diameter portion and the small diameter portion.

* * * * *